United States Patent [19]

Meusel et al.

[11] Patent Number: 4,672,511
[45] Date of Patent: Jun. 9, 1987

[54] ELECTRICAL INSTALLATION COMPRISED OF INDIVIDUAL ASSEMBLIES

[75] Inventors: Otto Meusel, Erlangen; Siegfried Seidel, Amberg; Heinz-Dieter Muench, Amberg; Guenther Deinhardt, Amberg, all of Fed. Rep. of Germany

[73] Assignee: Siemens Aktiengesellschaft, Berlin and Munich, Fed. Rep. of Germany

[21] Appl. No.: 736,227

[22] Filed: May 20, 1985

[30] Foreign Application Priority Data

May 21, 1984 [DE] Fed. Rep. of Germany ....... 3418902

[51] Int. Cl.$^4$ ............................................. H05K 1/14
[52] U.S. Cl. .................................. 361/415; 361/380; 361/428
[58] Field of Search ............ 339/17 M; 361/341, 346, 361/355, 361, 394, 395, 415, 426, 428; 211/41

[56] References Cited

U.S. PATENT DOCUMENTS 4,510,552 4/1985 Kanno et al. ...................... 361/394

FOREIGN PATENT DOCUMENTS 2810071 4/1981 Fed. Rep. of Germany .

OTHER PUBLICATIONS

Kehley et al, "Card-Retention Clip", IBM Technical Disclosure Bulletin, vol. 23, No. 11, 4/81, p. 4884.
Guttridge et al, "Modularized PC Assembly", IBM Technical Disclosure Bulletin, vol. 20, No. 6, 11/77, pp. 2162-2163.

Primary Examiner—Philip H. Leung
Assistant Examiner—Gregory P. Thompson
Attorney, Agent, or Firm—Volker R. Ulbrich

[57] ABSTRACT

The invention concerns an electrical system consisting of removable, variably sized, individual sub-assemblies interconnected electrically and physically with an assembly carrier. This assembly carrier provides mounting for connectors of various configurations which mate with the individual sub-assemblies, and also provides mounting for the sub-assemblies themselves. The sub-assembly mounting is by means of a U-shaped projection on which each sub-assembly attaches and then pivots into its secured position. The sub-assembly electrical connectors are mated to the assembly carrier connectors during this pivoting into position. The U-shaped projection is surrounded in a direction perpendicular to the carrier by guide plates providing lateral location and separation of the variably-sized individual sub-assemblies.

15 Claims, 7 Drawing Figures

ELECTRICAL INSTALLATION COMPRISED OF INDIVIDUAL ASSEMBLIES

BACKGROUND OF THE INVENTION

The invention relates to an electrical installation comprising individual assemblies mounted on an assembly carrier, the latter comprising plug or socket connectors mounted on circuit boards which can cooperate with mating connectors on the assemblies by means of a pivotal action of the assemblies with the carrier.

In a known electrical installation similar to the above-mentioned type, German Patent Specification No. 2,810,071, there is provided a standard carrier rail, by which the plug or socket connectors are snapped together and connected with each other by a bus. The individual assemblies are located by protrusions thereon behind an edge of the standard carrier rail. By means of a pivotal movement of the assemblies, connectors provided thereon are brought into engagement with the plug or socket connectors on the carrier. The assemblies are locked in position by means of another protrusion of the carrier rail.

According to the present invention there is provided an electrical installation comprising individual assemblies mounted on an assembly carrier, the latter comprising plug or socket connectors which can cooperate with mating connectors on the assemblies by means of a pivotal action of the assemblies on the carrier, the assembly carrier comprising a profiled plate formed with a U-profile. One side of the U-profile has notches spaced apart at distances in accordance with the widths of the assemblies, and the other, shorter side of the U-profile faces the assemblies and provides a pivotal axis for the assemblies. Also mounted upon the shorter side of the U-profile are guide plates for the lateral guidance of the assemblies. These guide plates have extensions which can be snapped into said notches.

This invention is capable of providing a good mounting support and cooperation of the assemblies with the plug or socket connectors, even when the assemblies are of different widths. Good lateral guidance for the individual assemblies is also provided. Moreover, greater variability is given with regard to bus lines.

In order to provide secure mounting of the assemblies even in the case of extreme vibrations, that is, irrespective of the location of the installation place, it may be advantageous if the profiled plate has a C groove for the introduction of insert nuts which may be held between the guide plates in the longitudinal direction of the groove. The nuts are cooperable with screws to secure the assemblies.

In order to fix the position of the insert nuts in relation to an assembly, but yet to allow certain tolerances when introducing the cooperating fastening screws, it may be advantageous if the nuts are mounted loosely in the groove longitudinal direction of projections from a nut rail. The nut rail may be a simple stamped bent element. The nuts used here can be standard commercially available nuts mounted in the rail. Mounting support of the nut rail in the groove (and with that of the associated nuts) at a certain point can be achieved if a nut is fixed by means of a threaded pin, which has been screwed into the nut in the groove.

In order to determine, in a simple manner, whether the assemblies have been secured in terms of order after their pivotal movement, it is desirable for the fastening screws which cooperate with the insert nuts to be spring-loaded in opposition to their screwing-in direction and to project beyond front faces of the assemblies in their non-screwed-in state.

The fastening screws which project beyond the assemblies not only serve as indicators, but also as an aid for withdrawal of the assemblies. They also provide reliable electrical connection of the assemblies through the connectors on their rear sides, and with that a safeguard the integrity of the electrical connection during shock and vibration.

It is possible to dispense with notches, rings and tightening means for the mounting support of the fastening screws if the fastening screws have lugs pressed thereon and are held on the assemblies in circularly ending stop recesses.

By means of inclination of the fastening screw its introduction and removal, when the stop recesses are constructed in the form of a slot and there are a maximum of two lugs lying opposite, is also possible if a through hole is present for the fastening screw at its forward end.

A simple mounting support for the plug or socket connectors which are cooperable with the assemblies may be provided on the profiled plate if a printed circuit board carrying the connectors can be introduced into grooves provided in mounting strips formed on the profiled plate. An all round electrical connection between the individual assemblies is possible as a result of the printed circuit board.

So that it may be possible to install assemblies with different mating plug or socket type connectors on the profiled plate, it is desirable to have provided on the printed circuit board, in accordance with the values of their spacing, possibilities for attaching different designs of plug or socket type connectors. In this way, the versatility of the profiled plate is increased further.

It is expected that during operation, assemblies with different mating plug or socket connectors are to be used; the profiled plate can also be provided, according to the function, with different plug or socket type connectors which are provided within one divison.

In order to improve the mounting support of the assemblies as regards their electrical connection, for example, with regard to an external earth contact, it is desirable for a groove to be provided on the profiled plate for the insertion of one of the edges of an elongated fingered spring. It is possible to insert the fingered spring at a point required for the assemblies, and the spring may be secured mechanically and contacted electrically with the profiled plate in an improved manner by squeezing the groove closed onto the spring. As a result of the squeezing action, an oxide film which might be present breaks, and this amounts to cold-sealing similar to that provided by a crimped connection. For this purpose, it is desirable for the fingered spring to be folded-over at its one edge and for the fingered spring to have recesses in the region of the groove. Surface treatment of the profiled plate is not necessary, as a result of the cold-sealing between fingered spring and profiled plate. If the assemblies are provided with contacting lugs for the printed circuit board in the region of the fingered spring, surface treatment of the assembly housings is unnecessary.

It is an object of this invention to provide an electrical installation comprised of individual assemblies with an improved method of mounting support. It is a second object of this invention to provide an installation with improved cooperation of the mating connector during plug-in actions. It is a third object of this invention to provide an installation which allows for great variability of connector type and individual assembly size as well as the interconnections between connectors and assemblies. It is another object of this invention to provide hold down screws which provide reliable electrical connection and indicate by their position when the screw is not completely engaged. It is a further object of this invention to provide a reliable electrical spring contact ground connection in the electrical installation for the individual assemblies for a ground connection.

SUMMARY OF THE INVENTION

Briefly stated in accordance with one aspect of the invention, the foregoing objects are achieved by providing an electrical installation for the mounting of individual electrical assemblies comprised of a profiled plate with a U-profile formed thereon. One side of the U-profile has notches spaced according to the widths of the individual electrical assemblies when installed. The other side of the U-profile provides a pivotal axis upon which the assemblies are pivoted into installed position. On the profile plate between and beneath the notches are mounted the mating connectors of the connectors on the individual electrical assemblies in such a position that the assemblies electrical rotate into connection therewith in the installed position. The profile plate with the mounted connectors is referred to as a carrier assembly. As the individual electrical assemblies are rotated into connection with the carrier assembly, they are guided by the lateral guide plates of guidance pieces which snap into the notches of the U-profile.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings.

FIG. 5 shows a sectional representation of one edge region of a fingered spring after the latter has been squeezed-in;

DESCRIPTION OF A PREFERRED EMBODIMENT

Figure 1:
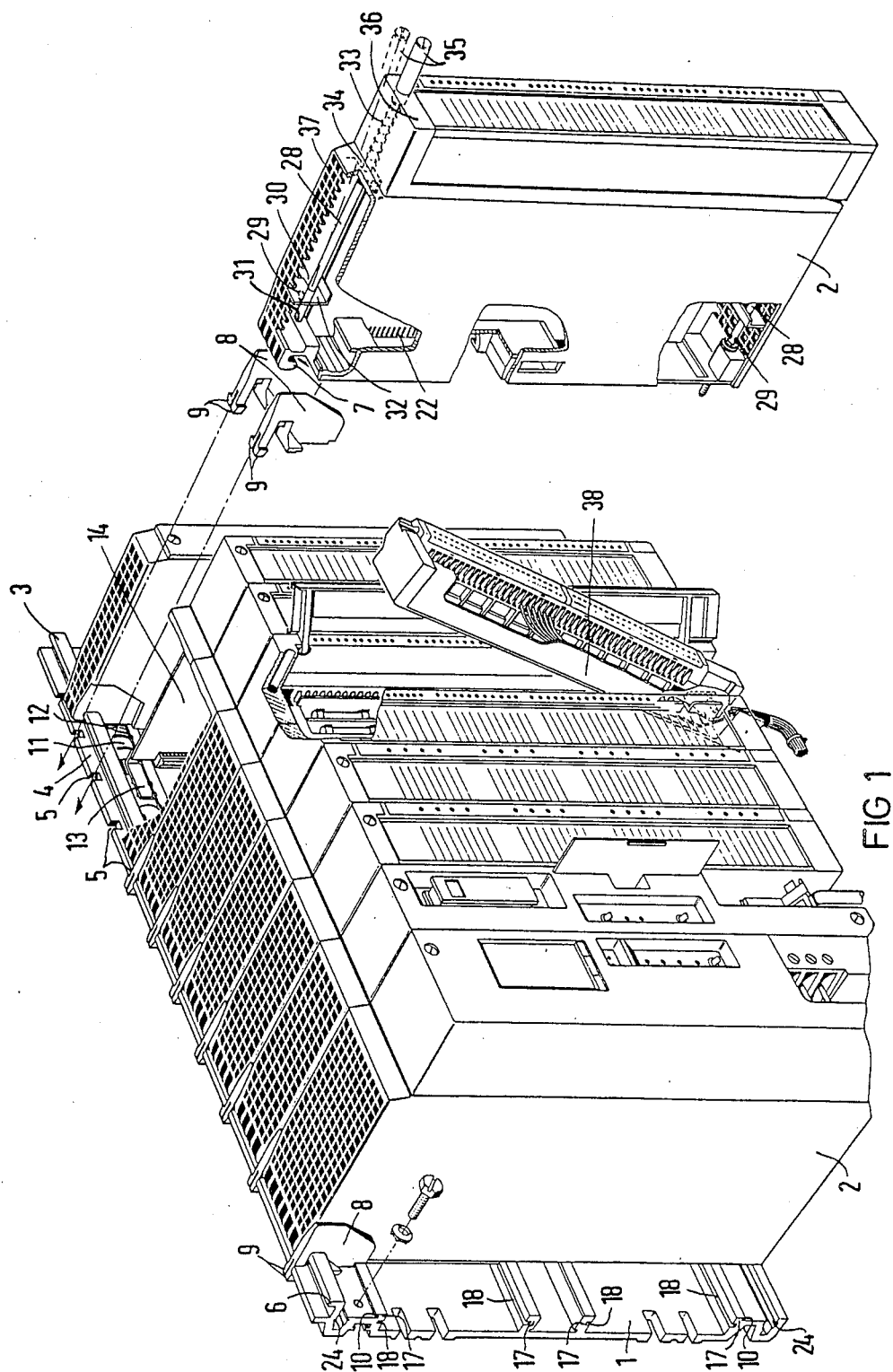
FIG. 1 shows a perspective representation of an electrical installation according to the invention, with a profiled plate as an assembly carrier, with one assembly remote from the assembly carrier.

The electrical installation which may be seen in FIG. 1 comprises an assembly carrier which is constructed as a profiled plate 1 onto which the assemblies 2 are secured.

The profiled plate 1 has a U-profile 3 providing an inward-swing pivot or bearing at its upper edge. The higher side 4 of the U-profile 3 has notches 5 at distances apart in accordance with the assembly width of the assemblies 2. The lower side 6 of the U-profile 3 serves as a pivotal axis for the pivotal mounting projection 7 of the assemblies 2. Extending around the shorter side 6, there are provided guide plates 8 for the lateral guidance of the assemblies 2, which plates 8 may be snapped-into the notches 5 of the higher side 4 by means of snap arms 9.

An elongated fingered spring 11 is pushed with one edge 12 into a groove 10 on the front side of the profiled plate 1. Two such springs 11 (i.e., a top and and a bottom spring) are provided in the two respective top and bottom grooves 10. The way in which the fingered spring 11 is secured is described with the aid of FIGS. 4 and 5, and it cooperates with a contacting lug 13 which is connected to the earth contact of the printed circuit boards 14 of the assemblies 2 to provide an external earth contact therefor. The grooves 10 are present in the top and bottom regions respectively of the profiled plate 1.

Figure 4:
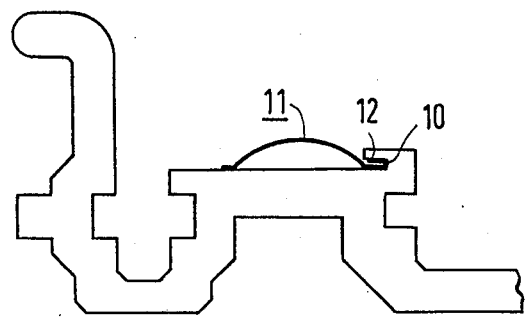
FIG. 4 shows a side view of a region of the profiled plate where a fingered spring has been set in place.
Figure 5:
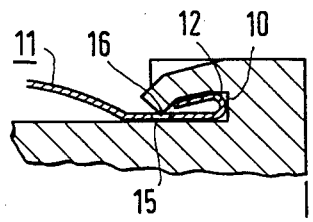

The fingered spring 11 is constructed so that is is folded at the one edge 12, as shown in FIGS. 4 and 5. Also, it is equipped with recesses 15 into which parts 16 of the edge of the groove 10 can be urged, as may be seen from FIG. 5, so that a secure and oxide-free contact between finger spring 11 and profiled plate 1 is established.

Figure 2:
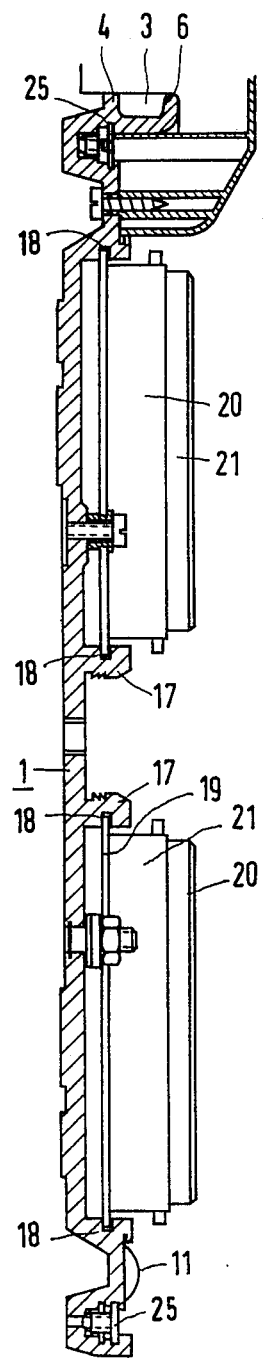
FIG. 2 shows a side view, partly in section, through the profiled plate with the printed circuit boards which carry socket-type connectors and which are introduced into grooves provided in mounting strips formed on the profiled plate.
Figure 3:
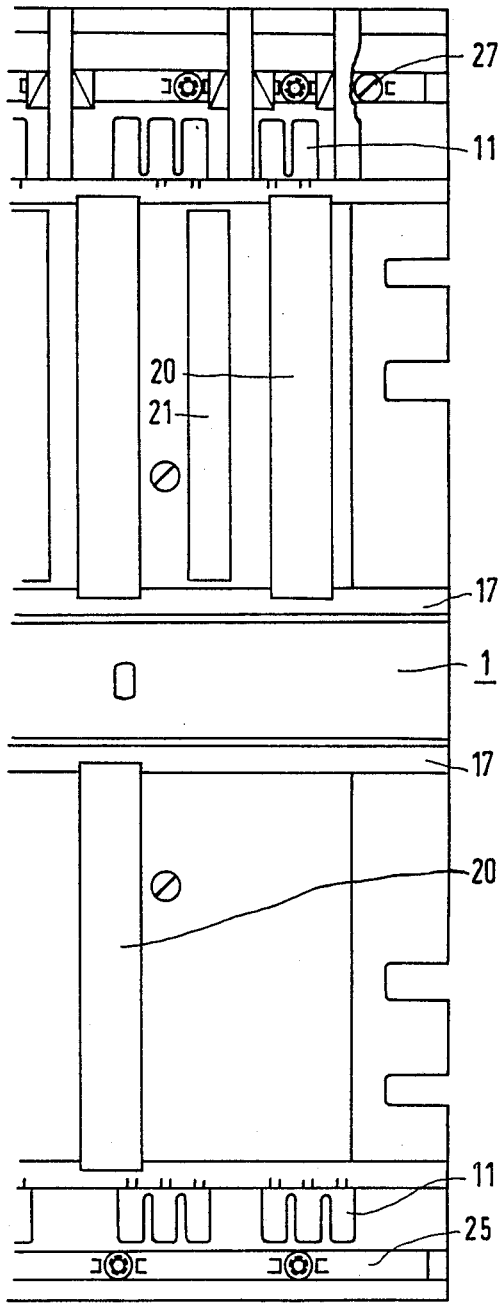
FIG. 3 shows a partial plan view of the profiled plate with assemblies removed.

As FIG. 2 shows mounting strips 17, which are formed on the profiled plate 1, has grooves 18 formed into which are inserted printed circuit boards 19 which are connected electrically and mechanically with socket-type connections 20 and 21 and which provide the electrical connections between the individual assemblies 2, one with another. The socket-type connectors 20 and 21 may be constructed differently from one another so that assemblies 2 with different mating plug-type connectors, as shown in FIG. 1 each has mounted inside an assembly 2 printed circuit board 14 which has a mating plug-type connector denoted as 22, such that the assemblies 2 can be connected onto the profiled plate 1.

Figure 6:
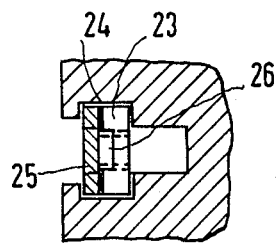
FIG. 6 shows a sectional representation of insert nuts, which are inserted into a groove, on a nut rail.
Figure 7:
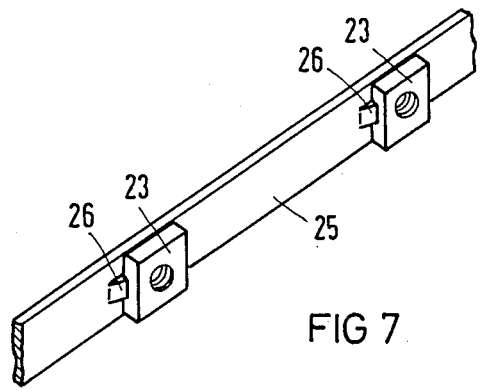
FIG. 7 shows a perspective representation of the nut rail.

For secure mounting support of the assemblies 2 on the profiled plate 1, even under the strain of shock, there are provided as shown in FIGS. 6 and 7, insert nuts 23 which are pushed into C grooves 24 of the profiled plate 1 together with a nut rail 25. The insert nuts 23 are mounted loosely, in the groove longitudinal direction, with respect to punched-out portions 26 of the nut rail 25, so that a certain mobility of the insert nuts is provided in the longitudinal direction. The nut rail 25 itself is fixed in the longitudinal direction by means of a threaded pin 27 which is screwed into an insert nut to brace the nut in the groove and accordingly secure the nut rail itself in the longitudinal direction.

Fastening screws 28, as shown in FIG. 1, are screwed into the insert nuts 23 for the mounting support of the assemblies 2. The fastening screws 28 have lugs 29 which are pressed thereon and which are provided on two facing sides of the fastening screw, which is only threaded in the lower region. The walls surrounding stop apertures 30, each ending in the form of a slot, serve to support the fastening screws 28 in the housings of the assemblies 2.

After inclination to the position indicated by dashed lines in FIG. 1, the upper screw 28 may be introduced into the bore hole 31 at the base of the assembly 2 and the lugs 29 can be pushed behind the cross-piece 32 containing the stop aperture 30. Return of the fastening screw 28 into the position represented by unbroken lines in FIG. 1 is achieved with installation of the spring 33 braced up against the cross-piece 34 of the housing. The portion 35 of the screw 28 serves as an indicator or handle and projects beyond the front wall of the assembly 2. For the purposes of insertion, the covering 36 and the side wall 37 of the assembly 2 can be removed.

The screw head of the lower screw 28 prevents the plug-type connection strip 38 from swinging into engagement with circuit board socket provided that the lower screw 28 is not screwed into its respective insert nut 23.

As will be evident from the foregoing description, certain aspects of the invention are not limited to the particular details of the examples illustrated, and it is therefore contemplated that other modifications or applications will occur to those skilled in the art. It is accordingly intended that the claims shall cover all such modifications and applications as do not depart from the true spirit and script of the invention.

What is claimed as new and desired to be secured by Letters Patent of the United States is:

1. An electrical installation mounting individual electrical assemblies comprising:
    a profiled plate formed with a U-profile thereon, one side of the U-profile having notches spaced apart at distances according to the widths of the electrical assemblies and the other side of the U-profile, facing the electrical assemblies providing a pivotal axis for the electrical assemblies;
    an electrical connector mounted on the profiled plate, located vertically below and horizontally between the notches, the electrical connector connecting with a mating connector and mounted on one of the individual electrical assemblies by means of a pivotal action about the pivotal axis, the mating connector and the plate thereby forming an assembly carrier; and
    a guide piece having lateral guide plates providing guidance for one of the electrical assemblies and having snap action extensions fastened to the notches in said one side of the U-profile.

2. An electrical installation according to claim 1, wherein the profiled plate is formed with a C groove which contains insert nuts cooperable with screws to secure the individual electrical assemblies.

3. An electrical installation according to claim 2, further comprising a nut rail located in the C groove longitudinal direction, having projections therefrom loosely holding the nuts.

4. An electrical installation according to claim 2, wherein at least one of said nuts is fixed in the C groove by means of a threaded pin screwed into the nut.

5. An electrical installation according to claim 4, wherein said at least one nut in turn affixes the nut rail in the C groove.

6. An electrical installation according to claim 2, wherein said screws are spring loaded to prevent insertion into the nuts and causing said screws to project beyond a plane of the front surface of the individual electrical assembly when the screw threads are not engaging one of the nuts.

7. An electrical installation according to claim 6, further comprising a stop having a stop aperture therein, connected to each of the electrical assemblies surrounding each of the screws; and a lug connected respectively to each of said screws which in cooperation with the respective stop holds the screws in the electrical assembly.

8. An electrical installation according to claim 1, further comprising:
    mounting strips having grooves therein integrally formed upon the profiled plate; and
    a printed circuit board inserted into the mounting strip grooves.

9. An electrical installation according to claim 8, further comprising at least one additional electrical connector of different shape and type.

10. An electrical installation according to claim 1, wherein the profiled plate has a spring mounting groove therein mounting one longitudinal edge of an elongated fingered spring.

11. An electrical installation according to claim 10, further comprising the edge of the elongated fingered spring which is inserted into the spring mounting groove and secured by restricting or squeezing the spring mounting groove in the region of the edge.

12. An electrical installation according to claim 10, further comprising an elongated fingered spring having a folded over edge which is inserted into the spring mounting groove.

13. An electrical installation according to claim 11, wherein the elongated fingered spring has recesses on the edge in the region of the spring mounting groove.

14. An electrical installation according to claim 11, further comprising an electrical contacting lug, physically and electrically connected to a printed circuit board mounted within one of the individual electrical assemblies, making electrical contact with the elongated fingered spring.

15. An electrical installation according to claim 1, wherein each of the guide plates extends around said one side of the U-profile.

* * * * *